(12) United States Patent
Storage et al.

(10) Patent No.: US 11,480,069 B2
(45) Date of Patent: Oct. 25, 2022

(54) AVIONICS HEAT EXCHANGER

(71) Applicant: Unison Industries, LLC, Jacksonville, FL (US)

(72) Inventors: Michael Ralph Storage, Beavercreek, OH (US); Dennis Alan McQueen, Miamisburg, OH (US)

(73) Assignee: Unison Industries, LLC, Jacksonville, FL (US)

( * ) Notice: Subject to any disclaimer, the term of this patent is extended or adjusted under 35 U.S.C. 154(b) by 554 days.

(21) Appl. No.: 16/534,135

(22) Filed: Aug. 7, 2019

(65) Prior Publication Data

US 2020/0224553 A1 Jul. 16, 2020

Related U.S. Application Data

(60) Provisional application No. 62/717,021, filed on Aug. 10, 2018.

(51) Int. Cl.

| F01D 5/08 | (2006.01) |
|---|---|
| F01D 25/12 | (2006.01) |
| B64D 33/02 | (2006.01) |
| B64D 33/08 | (2006.01) |
| F28D 1/047 | (2006.01) |
| B21D 39/04 | (2006.01) |
| B23K 20/08 | (2006.01) |
| F04D 29/00 | (2006.01) |
| F02C 7/264 | (2006.01) |
| F25D 9/00 | (2006.01) |
| F28D 21/00 | (2006.01) |

(52) U.S. Cl.
CPC ............. *F01D 25/12* (2013.01); *B21D 39/04* (2013.01); *B23K 20/08* (2013.01); *B64D 33/02* (2013.01); *B64D 33/08* (2013.01); *F02C 7/264* (2013.01); *F04D 29/00* (2013.01); *F25D 9/00* (2013.01); *F28D 1/0477* (2013.01); *B64D 2033/024* (2013.01); *F05D 2220/323* (2013.01); *F28D 2021/0021* (2013.01); *F28D 2021/0029* (2013.01); *F28F 2280/06* (2013.01)

(58) Field of Classification Search
CPC ......... F01D 25/12; B21D 39/04; B23K 20/08; B64D 33/02; B64D 33/08; B64D 2033/024; F02C 7/264; F04D 29/00; F25D 9/00; F28D 2021/0029; F28D 2021/0021; F28D 1/0477; F05D 2220/323
USPC ....................................................... 415/175
See application file for complete search history.

(56) References Cited

U.S. PATENT DOCUMENTS

| 5,553,461 A | 9/1996 | Hitzigrath et al. |
| 6,474,534 B2 | 11/2002 | Gabbianelli et al. |
| 7,131,612 B2 | 11/2006 | Baptist et al. |
| 7,946,806 B2 | 5/2011 | Murphy |

(Continued)

FOREIGN PATENT DOCUMENTS

| FR | 3028133 A1 | 5/2016 |
| GB | 2544979 A | 6/2017 |

*Primary Examiner* — Claire E Rojohn, III
(74) *Attorney, Agent, or Firm* — McGarry Bair PC

(57) ABSTRACT

Aircraft turbine engines are controlled by complex electronic devices such as FADEC and PSS units. These devices can be adversely impacted by the engine environment including the condensing of evaporated water. Aspects of the present disclosure include unique heat exchangers to control the temperature of these electronic devices to assure their proper operation.

20 Claims, 8 Drawing Sheets

(56) References Cited

U.S. PATENT DOCUMENTS

| | | | |
|---|---|---|---|
| 8,867,210 B2* | 10/2014 | Harmelink | H05K 7/20254 |
| | | | 174/15.1 |
| 10,450,957 B2* | 10/2019 | Pearson | F01D 25/12 |
| 10,842,044 B2* | 11/2020 | Snyder | F02C 7/16 |
| 11,015,468 B2* | 5/2021 | Zaccardi | F01D 9/041 |
| 11,306,974 B2* | 4/2022 | Tan | H01L 33/64 |
| 11,320,211 B2* | 5/2022 | Liu | F28D 15/0233 |
| 2017/0010046 A1 | 1/2017 | Hofbauer | |
| 2017/0198719 A1* | 7/2017 | Cerny | F28F 3/12 |
| 2017/0327233 A1* | 11/2017 | Avignon | B64D 13/006 |
| 2018/0023416 A1* | 1/2018 | Riaz | F01D 25/12 |
| | | | 415/1 |
| 2018/0051946 A1* | 2/2018 | Stambaugh, Sr. | F02C 7/185 |
| 2019/0310034 A1* | 10/2019 | Kobayashi | H01L 21/67253 |
| 2020/0011455 A1* | 1/2020 | Jonnalagadda | F16L 9/19 |
| 2020/0041219 A1* | 2/2020 | Storage | F28F 9/26 |
| 2020/0200040 A1* | 6/2020 | Jiang | F02C 7/14 |
| 2020/0200087 A1* | 6/2020 | Luschek | F02C 7/14 |

\* cited by examiner

AVIONICS HEAT EXCHANGER

CROSS-REFERENCE TO RELATED APPLICATION(S)

This application claims the benefit of U.S. Provisional Patent Application No. 62/717,021, filed Aug. 10, 2018, which is incorporated herein by reference in its entirety.

BACKGROUND

Aircraft engines require highly reliable systems for control to ensure safe and efficient operation. Reliable control for more sophisticated gas turbine engines, and even some piston engines, is maintained, for example, by a Full Authority Digital Engine Control (FADEC), which controls engine operation. A FADEC receives cockpit commands in the form of a signal indicative of a performance level required from an engine. The FADEC also receives signals from a variety of sensors and other systems around the engine and the aircraft. The FADEC applies a set of control rules to the received signals and determines control signals to send to effectors on and around the engine. The control signals sent by the FADEC direct the effectors in such a way as to produce the required engine performance level. The FADEC performs this control function many times per second.

BRIEF DESCRIPTION

An aspect of the disclosure relates to an avionics control assembly including an engine control device having an avionics housing defining an exterior and an interior, with at least one connector extending from the exterior of the avionics housing and at least one sensor located within the interior and a heat exchanger including a duct defining a fluid pathway including at least one fluid passageway leading from an inlet port of the heat exchanger to an outlet port of the heat exchanger, the duct defining a length with a rearmost face and wherein when the duct is operably coupled to the exterior of the avionics housing at least one first portion of the rearmost face is spaced from the exterior of the avionics housing and at least one second portion of the rearmost face is in contact with the exterior of the avionics housing and heat from liquid flowing through the fluid pathway is transferred to the avionics housing

DETAILED DESCRIPTION

Figure 1:
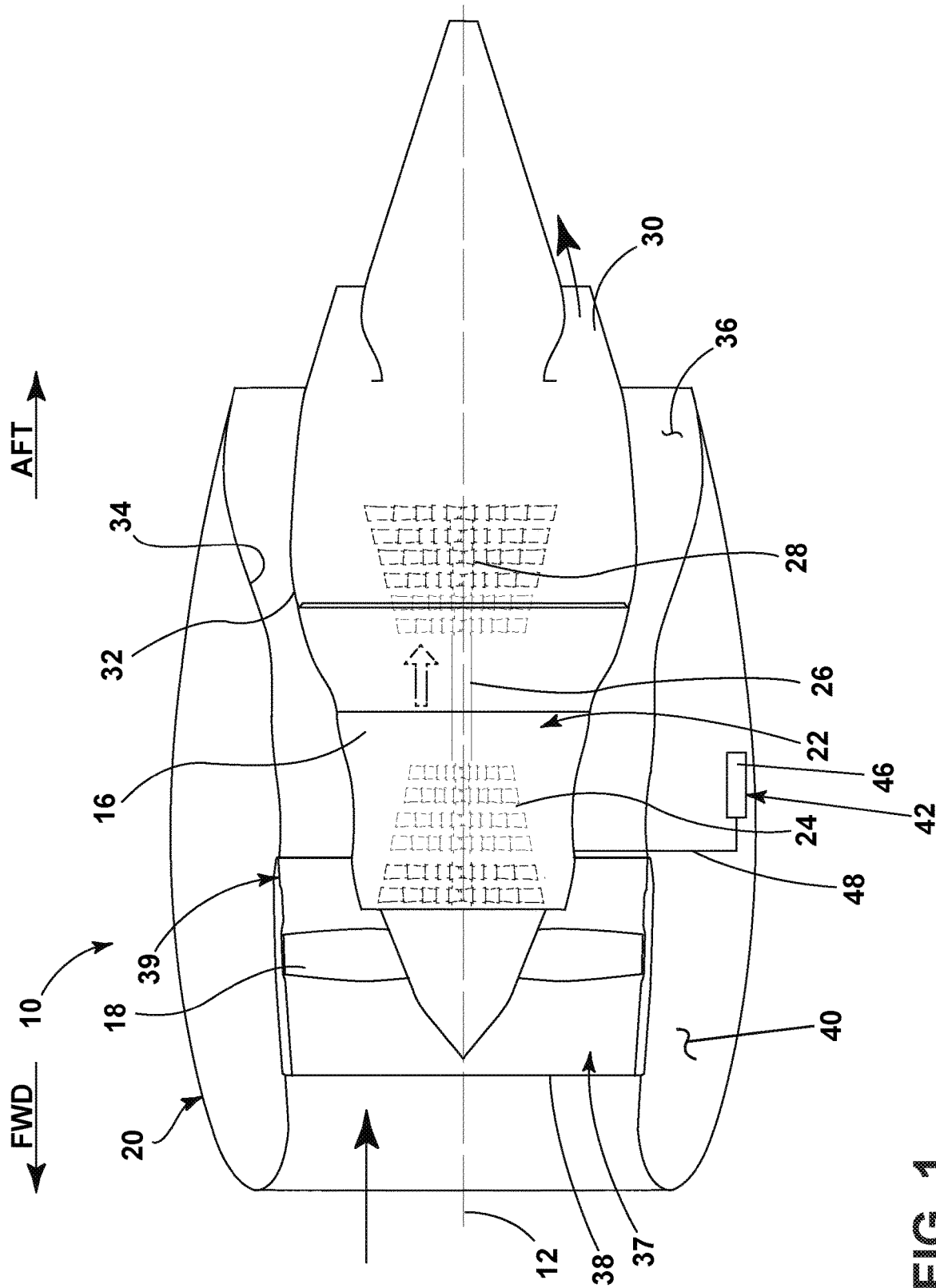
FIG. 1 is a schematic, partially cut away view of a turbine engine assembly.

Aspects disclosed herein relate to a heat exchanger for engine control devices such as the FADEC or PSS, which can be included in or separate from the FADEC. Both the FADEC and PSS have been historically mounted on the engine case to minimize the routing length of the sensor and actuator wiring. The FADEC and other known components such as the PSS can develop problems in service as evaporated water in the components condenses, accumulates, and then freezes. The evaporated and condensed water does not pose as much of an issue during operation if any as compared to the frozen water. In the case of the PSS, which includes diaphragms that measure pressure differences in air from the compressors of the engine, the air can be blocked, the diaphragm can be damaged, or the sensor output can be partially fouled by the frozen water. Aspects of the present disclosure utilize a heat exchanger to provide convective and conductive heat to eliminate frozen water in such engine control devices.

The heat exchanger for engine control devices is described herein in the environment of a turbine engine; particularly, a heat exchanger for a FADEC or PSS unit. It will be understood, however, that aspects of the disclosure described herein are not so limited and may have general applicability within any avionics element or system, as well as in non-aircraft applications, such as other mobile applications and non-mobile industrial, commercial, and residential applications.

As used herein, the term "upstream" refers to a direction that is opposite the fluid flow direction, and the term "downstream" refers to a direction that is in the same direction as the fluid flow. The term "fore" or "forward" means in front of something and "aft" or "rearward" means behind something. For example, when used in terms of fluid flow, fore/forward means upstream and aft/rearward means downstream. Additionally, as used herein, the terms "radial" or "radially" refer to a direction away from a common center. For example, in the overall context of a turbine engine, radial refers to a direction along a ray extending between a center longitudinal axis of the engine and an outer engine circumference. Furthermore, as used herein, the term "set" or a "set" of elements can be any number of elements, including only one.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are only used for identification purposes to aid the reader's understanding of the present disclosure, and do not create limitations, particularly as to the position, orientation, or use of aspects of the disclosure described herein. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order, and relative sizes reflected in the drawings attached hereto can vary.

Referring to FIG. 1, a turbine engine assembly 10 defines a longitudinal engine centerline 12 extending from forward to aft. A turbine engine 16, a fan assembly 18, and a nacelle 20 can be included in the turbine engine assembly 10, with portion of the nacelle 20 cut away for clarity. The turbine engine 16 can include an engine core 22 having a compressor section 24, a combustion section 26, a turbine section 28, and an exhaust section 30. An inner cowl 32 radially surrounds the engine core 22. The nacelle 20 surrounds the turbine engine 16 including the inner cowl 32 and the core engine 22. In this manner, the nacelle 20 forms an outer cowl 34 radially surrounding the inner cowl 32. The outer cowl 34 is spaced from the inner cowl 32 to form an annular passage 36 between the inner cowl 32 and the outer cowl 34. The annular passage 36 characterizes, forms, or otherwise defines a nozzle and a generally forward-to-aft bypass airflow path. A fan casing assembly 37 having an annular forward casing 38 and an aft casing 39 can form a portion of the outer cowl 34 formed by the nacelle 20 or can be suspended from portions of the nacelle 20 via struts (not shown) or other suitable mounting structures.

The outer cowl 34 can include a hollow compartment 40 that houses one or more mechanical or electronic components therein. For example, an avionics control assembly or engine control assembly 42 is coupled, either by wired or wirelessly connectivity, in communication with one or more subsystems or components of turbine engine assembly 10 to control the operation of turbine engine assembly 10. It will be understood that the engine control assembly 42 can be any suitable system for controlling one or more subsystems or components of turbine engine assembly 10. By way of non-limiting example, the engine control assembly 42 can include a FADEC system 46. The connection with the turbine engine assembly 10 is schematically illustrated by connection 48 and can further represent any fluid communication necessary such as compressed air from the compressor section 24 to a PSS 50 (FIG. 2), which can be incorporated into the FADEC system 46 or can form a separate engine control assembly 42. Further still, the connection 48 can represent a fluid communication such as engine oil to and from a heat exchanger 52 (FIG. 2) that can be included in the engine control assembly 42.

Figure 2:
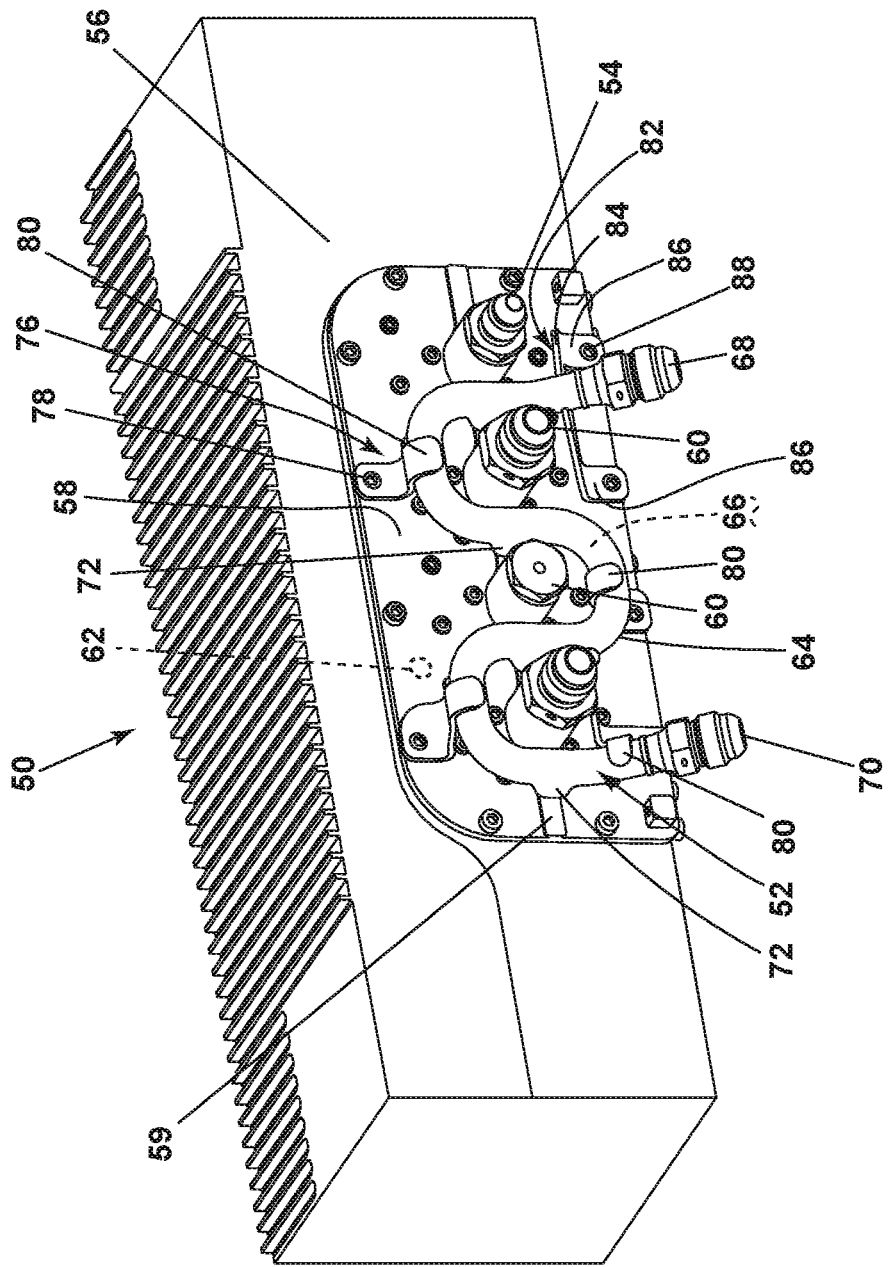
FIG. 2 is a perspective view of an exemplary PSS with a heat exchanger according to aspects of the present disclosure.

FIG. 2 illustrates a PSS 50 that can include pressure transducer(s), schematically illustrated at 51, which can act as a pressure detection system as part of an engine control assembly 42 (FIG. 1) regardless of whether the PSS 50 is incorporated in or separate from a FADEC system 46. For example, the PSS 50 can be separate from the FADEC and communicatively coupled thereto. The PSS 50 can be used to detect pressure through a cable, hose, channel, or pipe. At least one pressure input 54 is included in the PSS 50. The at least one pressure input 54 can be any suitable pressure input including, by way of non-limiting example, a nipple or nozzle that can be connected to the cable, hose, channel, tube or pipe. The at least one pressure input 54 is located on an exterior of a housing 56 of the PSS 50 and is in communication with a set of transducers 51 located within the housing 56.

In the illustrated example, the at least one pressure input 54 is illustrated on a front face 58 of the housing 56, by way of non-limiting example. It will be understood that the PSS 50 can include any number and variety of other connectors 60; for example, these can include any suitable connectors including cable connectors. It is common, although not necessary, for the at least one pressure input 54 and the other connector(s) to all be located on the front face 58 for ease of usability. The front face 58 can be a separate body from a remainder of the housing 56 and can be fastened thereto to form an interior of the housing 56. By way of non-limiting example, the front face 58 has been illustrated as a plate, which can include a conductive plate 58a formed from a conductive material, such as a stainless steel plate or sheet or aluminum.

On a rear surface (not shown) of the front face 58 a set of sensors 62 (shown in phantom as a single sensor for clarity) for the PSS 50 can be located, mounted, adjacent, or otherwise operably coupled thereto. It will be understood that any number of sensors 62 can be included and that the sensors can be located in any suitable manner within the housing 56 of the PSS 50

The heat exchanger 52 is illustrated as a duct 64 defining an interior 66 that is fluidly coupled to an inlet port 68 and an outlet port 70. The duct 64 is configured such that it is wound about the pressure input 54 and connectors 60 mounted to the front face 58 of the PSS 50. In this manner the duct 64 conforms to the PSS 50 and its configuration such that the heat exchanger 52 can be retro-fit onto an existing PSS 50. More specifically, the duct 64 can be wound, profiled, shaped, or conformed in any suitable manner so that it can provide the desired amount of heat transfer to the front face 58. A rear portion, the portion facing the front face 58, of the duct 64 includes a set of extensions 72. The extensions 72 can directly contact the front face 58 while a remainder of the duct 64 is held off of the front face 58.

In the illustrated example, several types of mounting fixtures are illustrated as being utilized to affix the duct 64 to the front face 58. It will be understood that any suitable mounting mechanisms can be utilized and that the mounting fixtures illustrated are merely for exemplary purposes. For example, a set of first mounting brackets 76 include a portion containing an aperture 78 used to fasten the first mounting bracket 76 to the front face 58 via a fastener such as a screw (not shown). A hook 80 is located on an opposite end of the first mounting bracket 76 and is configured to retain a portion of the duct 64. In the illustrated example, the hook 80 and thus the opening formed by the hook 80 can be oriented at various angles to retain sections of the duct 64. Further still, a second mounting bracket 82 having an elevated body 84 and legs 86 with apertures 88 is also illustrated as holding the inlet port 68 away from the front face 58. The elevated body 84 is also held off the front face 58 limiting the conduction of heat from that portion of the duct 64.

Figure 3:
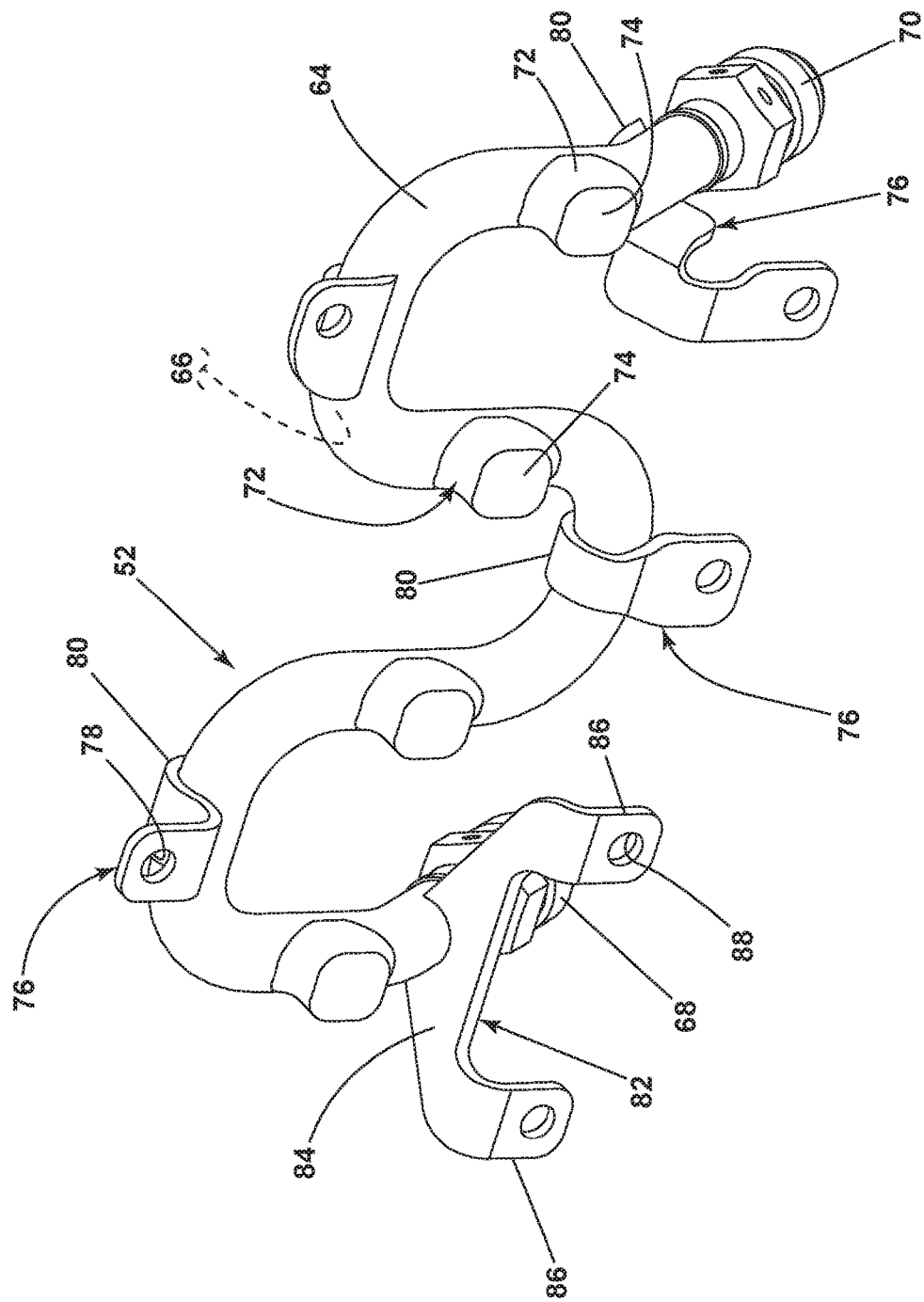
FIG. 3 is a perspective rear view of the heat exchanger of FIG. 2.

As illustrated more clearly in FIG. 3, the set of extensions 72 can include a rearmost face 74 on the end of the extension furthest away from the body of the duct 64. Each rearmost face 74 can be configured to provide a direct point for conductive heat transfer from the heat exchanger 52. While each rearmost face 74 has been generally illustrated as flat this need not be the case. The extension 72 and rearmost face 74 can also be generally shaped, profiled, or configured to fit within or complement a surface feature 59 on the front face 58.

The duct 64 can be formed in any suitable manner include that it can be a hydroformed-duct. Hydroforming is a process that restrains a bent tube, to be used in forming the duct 64, in a die having the desired final cross sections including those of the extensions. The tube is pressurized internally and simultaneously a very large force is applied on the ends of the bent tube to cause metal to plastically flow into the non-circular cross sections for the extensions. In the manner, the wall thicknesses in those non-circular sections can be maintained to acceptable levels.

In operation, the PSS 50 detects pressure as part of the FADEC system 46 or provides communication to the FADEC system 46 based thereon. Because of the environment within the nacelle 20 of the turbine engine assembly 10, evaporated water can enter the engine control assemblies 42 such as the PSS 50 or the FADEC system 46. In the event of atmospheric water vapor condensing and freezing any sensors utilized therein, including for example the sensors 62, can provide inaccurate data or outputs. Therefore, during operation the heat exchanger 52 can be utilized to provide sufficient heat to unfreeze or keep such condensed water from freezing allowing the engine control assemblies 42 such as the PSS 50 or the FADEC system 46 to function as intended. In addition to preventing freezing or thawing any water that has frozen within the housing 56, the heat exchanger 52 can also aid in evaporating any water therein.

Figure 4:
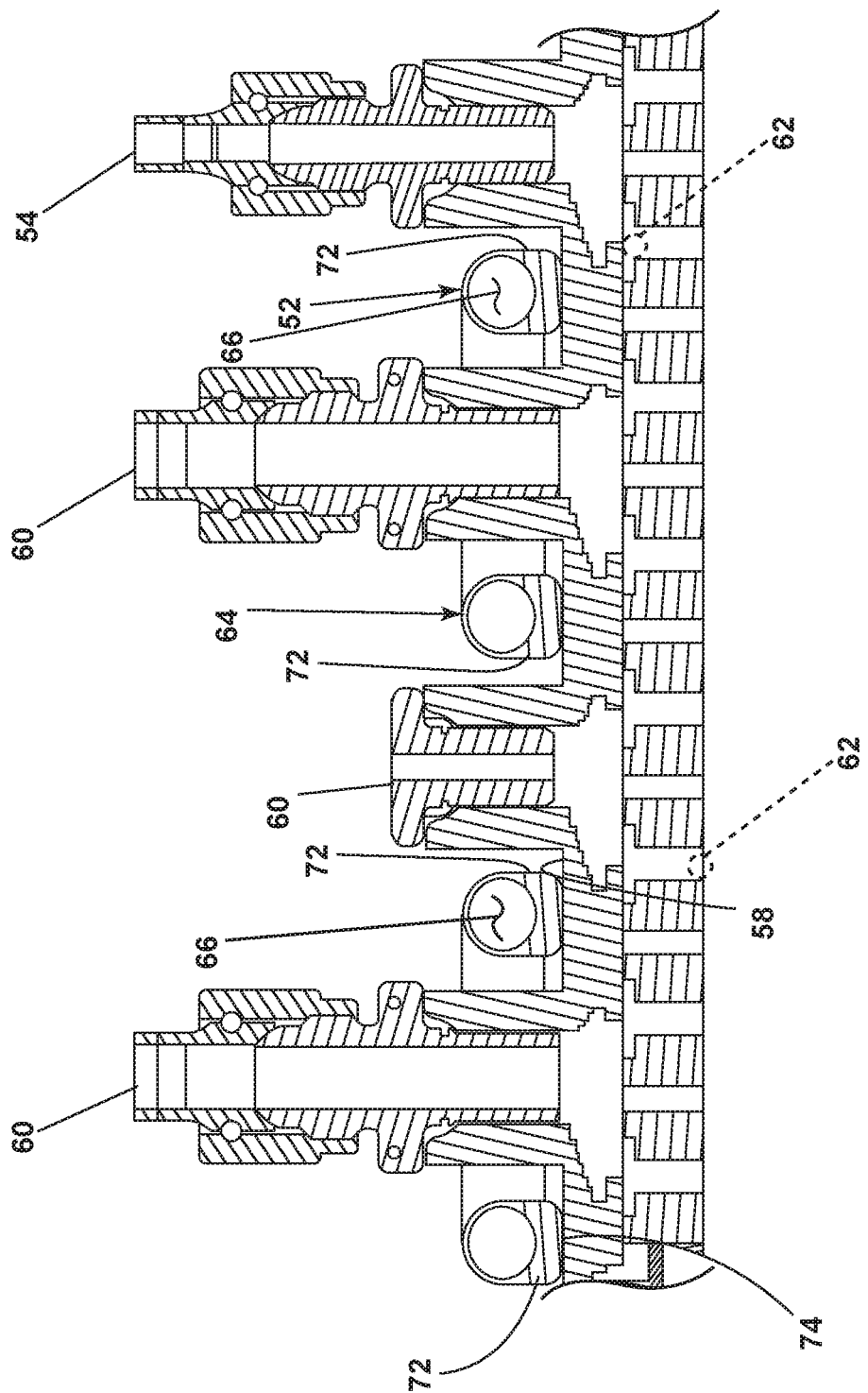
FIG. 4 is a cross-sectional view of a portion of the PSS and heat exchanger of FIG. 2.

More specifically, hot engine oil from the turbine engine assembly 10 is introduced into the inlet port 68 and flows through the interior 66 where it exchanges heat with the front face 58 via both conduction and convections and becomes cooler engine oil. As the extensions 72 directly contact the front face 58 they are the most likely source of thermal conduction. The contact between the extensions 72 and the front face 58 can best be seen in FIG. 4. It is contemplated that such extensions 72 can be strategically located along the duct 64 to provide for thermal transfer where additional heat may be needed including near the locations of the sensors 62. Two sensors 62 have been illustrated for additional exemplary purposes. Mounting brackets 82 and hooks 80 utilized to connect the heat exchanger 52 to the front face 58 (better illustrated in FIG. 3) also form paths for thermal heat transfer.

After passing through the duct 64 cooler engine oil exits out the outlet port 70 where it is returned to the turbine engine assembly 10 via connections 48. It is contemplated that one or more valves, thermal sensors, etc. can be included at locations between the turbine engine assembly 10 and the heat exchanger 52 such that hot engine oil can be prevented from reaching the heat exchanger if heating is unnecessary. Additionally or alternatively, the hot engine oil can be at a temperature that is acceptable to the electronics within the PSS 50.

One advantage is that the heat exchanger 52 conforms to the existing configuration of the electronic device or engine control assembly 42, in this case the PSS 50, and supplies heat via both convection and conduction to the housing 56. The heat that is applied to the front face 58 and the sensor(s) 62 can be sufficient to thaw frozen water or evaporate liquid water.

Figure 5:
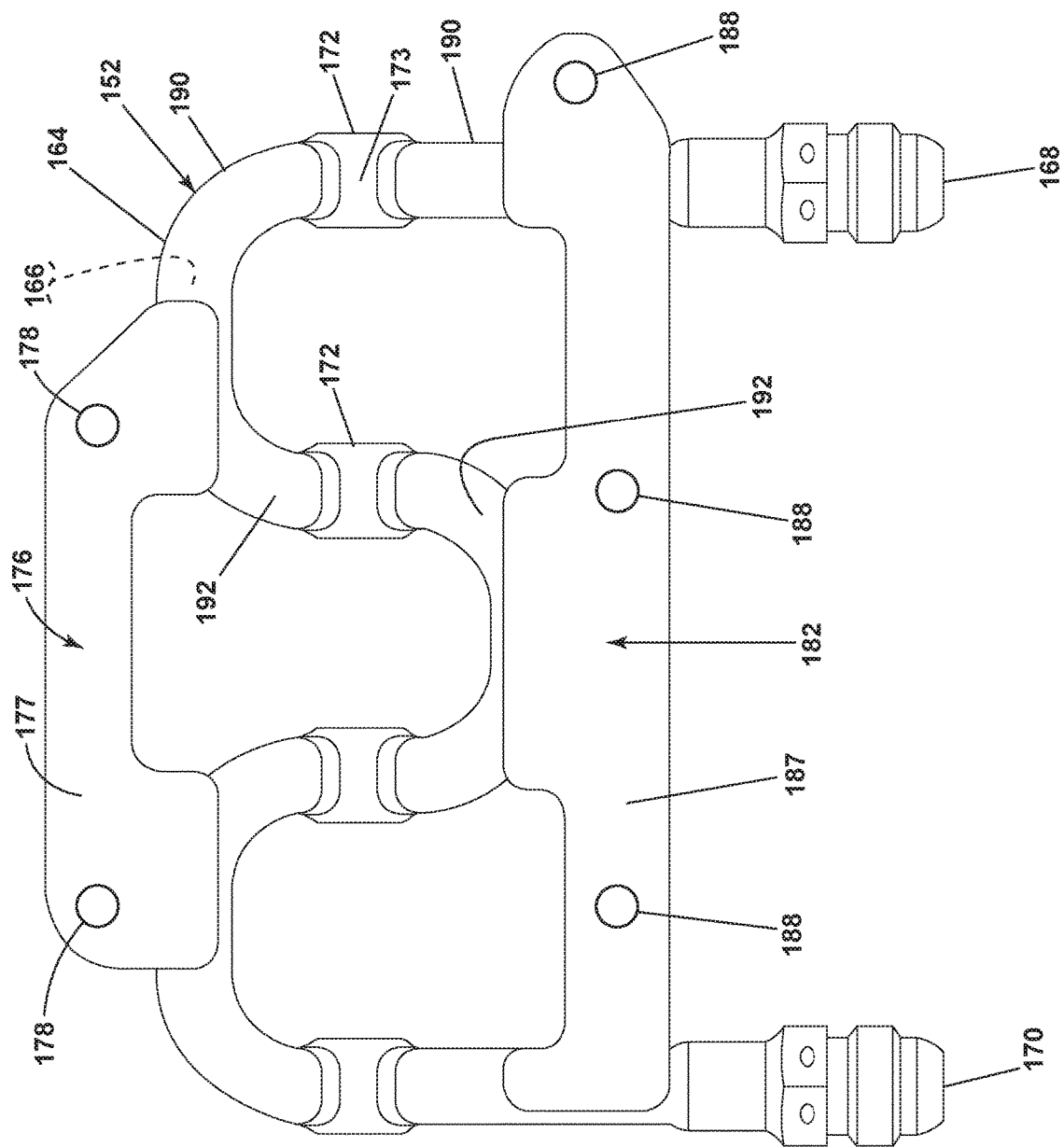
FIG. 5 is a front view of a heat exchanger that can be utilized according to an aspect of the present disclosure.

FIG. 5 illustrates a heat exchanger 152 that can be utilized with the PSS 50. The heat exchanger 152 is similar to the heat exchanger 52 previously described and therefore, like parts will be identified with like numerals increased by 100, with it being understood that the description of the like parts of the heat exchanger 52 applies to the heat exchanger 152, unless otherwise noted.

For instance, the heat exchanger 152 also includes a duct 164 defining an interior 166 that is fluidly coupled to an inlet port 168 and an outlet port 170. A rear portion, the portion facing the front face 58, of the duct 64 includes a set of extensions 72. The extensions 72 can directly contact the front face 58 while a remainder of the duct 64 is held off of the front face 58. Another similarity is that the heat exchanger 152 conforms to the existing configuration of the electronic device, in this case the PSS 50 (FIG. 7), and supplies heat via both convection and conduction to the front face 58, and the sensor(s) 62 requiring heat.

One difference is that the duct 164 includes side walls 190 and a generally flat upper surface 192 having a series of recesses 173. The recesses 173 in the generally flat upper surface 192 correspond to protrusions or extensions 172 forming a rearmost face 174 (FIG. 6) on a rear side of the duct 164.

Figure 6:
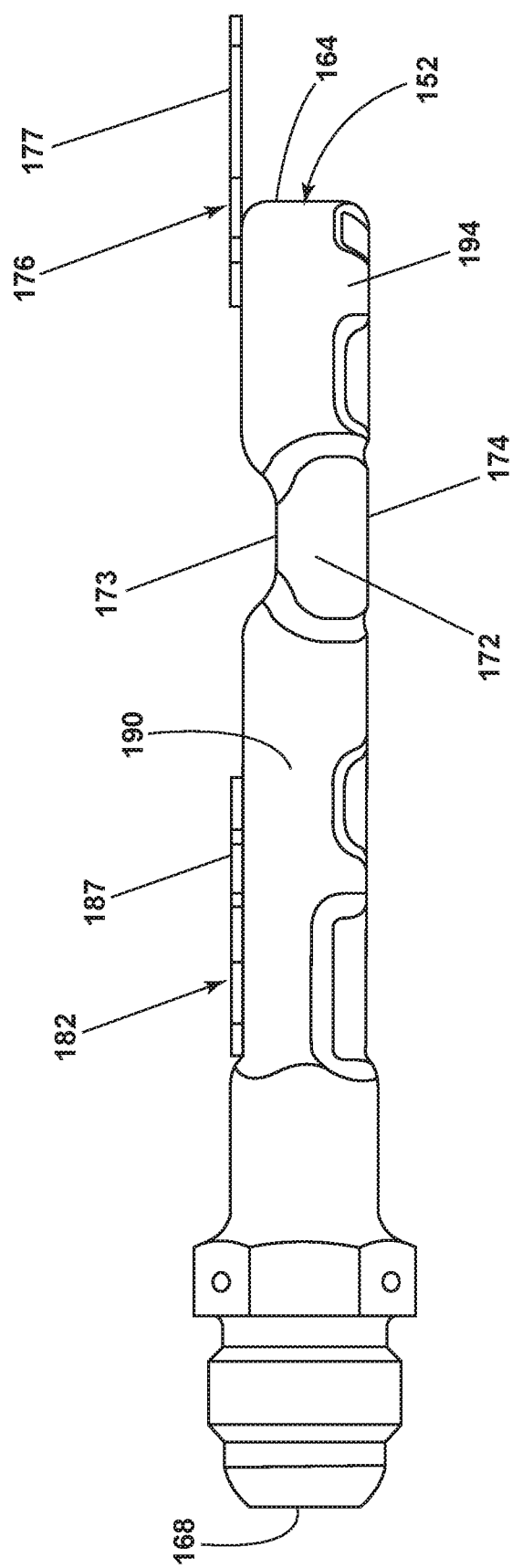
FIG. 6 is a side view of the heat exchanger of FIG. 5.

Another difference is that first mounting bracket 176 is illustrated as including body 177 having apertures 178 along its length. Second mounting bracket 182 is also shown having body 187 having apertures 188 spaced along its length. As can more easily be seen in FIG. 6, both the body 177 of the first mounting bracket 176 and the body 187 of the second mounting bracket 182 are planar bodies. In this manner the first mounting bracket 176 and the second mounting bracket 182 can included stamped sheet metal bodies. However, it will be understood that this need not be the case. FIG. 6 also more clearly illustrates that additional extensions 194 can be formed along portions of the duct 164 to create additional conduction points. Both the extensions 172 and the additional extensions 194 can be configured to provide a direct point for conductive heat transfer from the heat exchanger 152. While the rearmost face 174 has been generally illustrated as flat this need not be the case. The extensions 172 and the additional extensions 194 can generally have the same shape, profile, or configuration as surface features on the front face 58 (FIG. 7).

Figure 7:
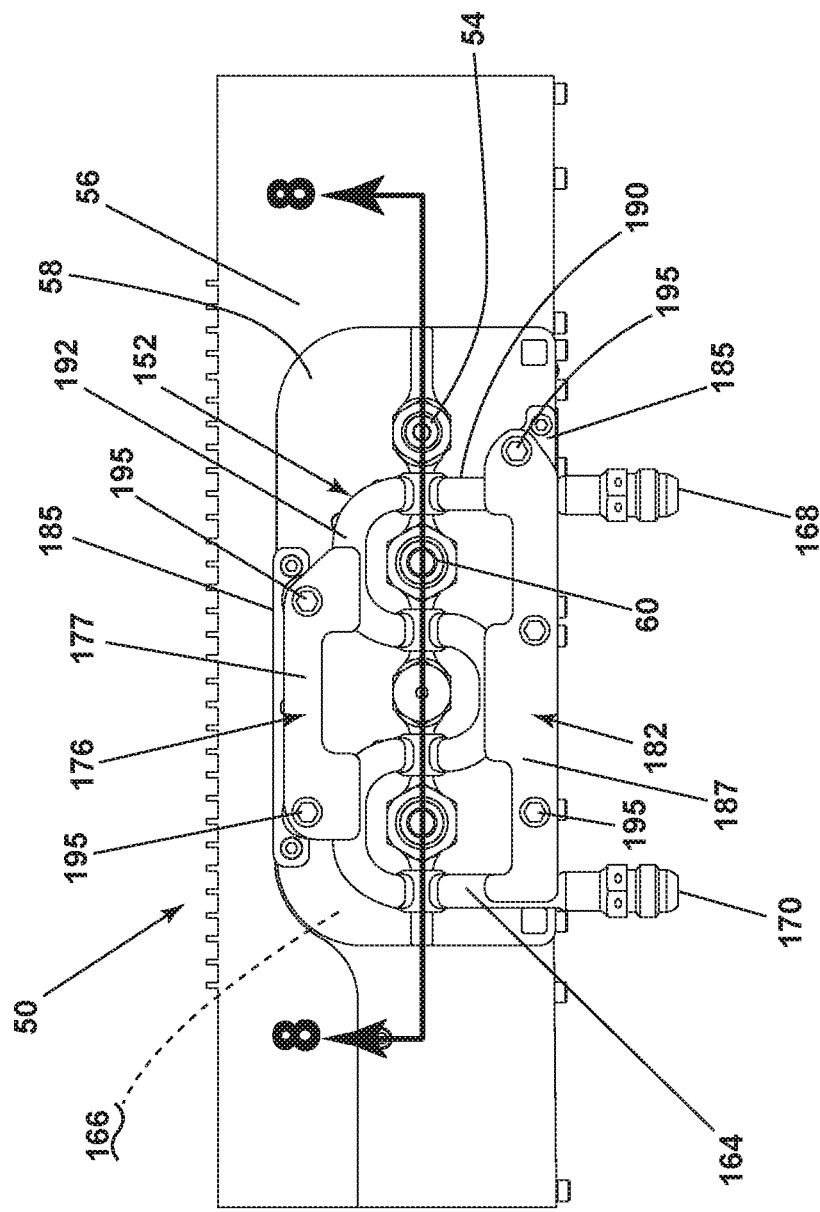
FIG. 7 is a front view of the heat exchanger of FIG. 5 mounted on the exemplary PSS of FIG. 2.

FIG. 7 better illustrates that the duct 164 is configured such that it is wound about the pressure input 54 and connectors 60 mounted to the front face 58 of the PSS 50. In this manner the duct 164 conforms to the PSS 50 and its configuration such that the heat exchanger 52 can be retro-fit onto an existing PSS 50. The duct 164 can be wound, profiled, shaped, or conformed in any suitable manner so that it can provide the desired amount of heat transfer to the front face 58. Secondary mounting structures 185 can be utilized for mounting the first mounting bracket 176 and the second mounting bracket 182 to the front face. The first mounting bracket 176 and the second mounting bracket 182 can be placed against the generally flat upper surface 192 of the duct 164 and mounted to the secondary mounting structures 185 via fasteners 195. The secondary mounting structures 185 span the height difference between the front face 58 and the first mounting bracket 176 and the second mounting bracket 182. Alternatively, the first mounting bracket 176 and the second mounting bracket 182 could be formed in an alternative manner with legs or other suitable features to mount a portion of the duct 164 to the front face 58.

Figure 8:
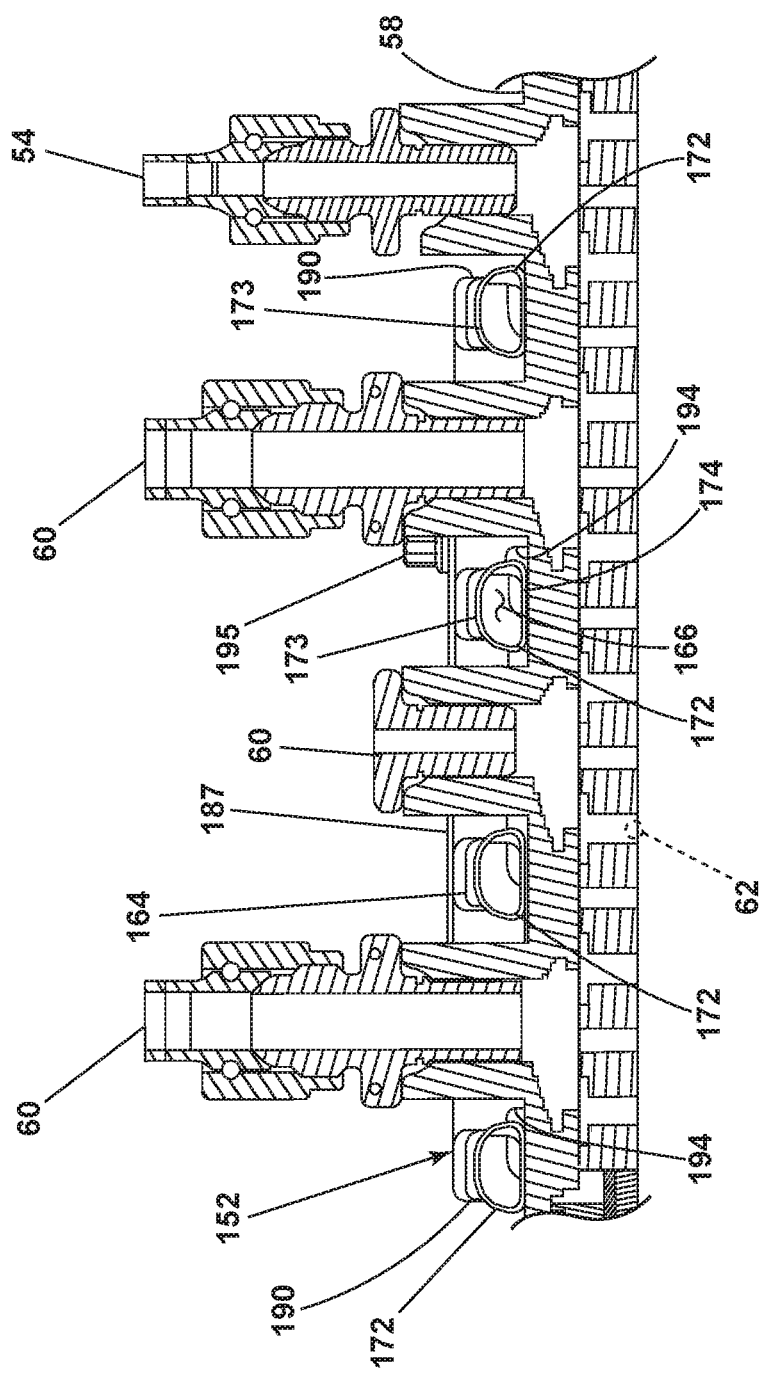
FIG. 8 is a cross-sectional view of a portion of the PSS and heat exchanger of FIG. 7.

The view in FIG. 8 also more clearly illustrates the non-circular shape of the interior 166 of the duct 164 where the duct 164 contacts the front face 58. It will be understood that the duct 164 may have any suitable shape, profile, or cross-section and that the illustration is merely for exemplary purposes. It is contemplated that hydroforming can be used to change the cross section, only where needed, such as at the locations that the duct 164 will be utilized to contact the front face 58.

Referring now to FIG. 8, the operation of the heat exchanger 152 is much like that of the heat exchanger 52. More specifically, in operation, the PSS 50 detects pressure utilizing one or more sensor(s). The heat exchanger 152 can be operated to provide heat to unfreeze or keep condensed water from freezing about the sensor(s) 62. The heat exchanger 152 can also aid in evaporating any water in the PSS 50. Hot engine oil introduced into the inlet port 168 flows through the interior 166 and out the outlet port 170 where it is returned to the turbine engine assembly 10. The heat exchanger 152 is configured to provide both convective and conductive heat to the front face 58. The heat exchanger 152 has more surfaces and more surface area in contact with the front face, which results in greater conduction than the previous heat exchanger. As the extensions 172 and the additional extensions 194 directly contact the front face 58 they are the most likely source of thermal conduction. The contact between the extensions 172 and the additional extensions 194 and the front face 58 can best be seen in FIG.

8. It is contemplated that such extensions 172 and the additional extensions 194 can be strategically located along the duct 164 to provide for thermal transfer where additional heat may be needed including near the locations of the sensor(s) 62. Further still, the mounting brackets 176 and 182 can also be utilized to conduct heat to the front face 158 via the secondary mounting structures 185.

It is also contemplated for any of the above heat exchangers that a thermally conductive paste can be utilized to further aid in heat transfer from the heat exchanger to the front face. It is contemplated that one or more valves, thermal sensors, etc. can be included at other locations between the turbine engine assembly and the heat exchanger. Such valve assemblies can provide for flow control of the hot engine oil passing through to the interior of the heat exchange. Such a valve may be located upstream of the heat exchanger. It will be understood that any suitable valve can be utilized.

Aircraft turbine engines are controlled by complex electronic devices such as FADEC and PSS units. These devices can be adversely impacted by the engine environment such as frozen water or freezing condensate. Therefore, such devices may need to be heated in order to function properly. Aspects of the present disclosure include unique conformal heat exchangers to control the temperature of these electronic devices to assure their proper operation. An exemplary technical effect of the systems and methods described herein includes at least one of supplying heat via at least one of convection or conduction to the regions requiring heat. Another benefit includes that the duct heat exchangers can be added to existing systems in the field as the heat exchangers are configured to work by conforming to the existing configuration of the electronic device. Another benefit is that the heat exchangers work by supplying heat via at least one of convection or conduction to the regions requiring heat. Further still, hydroformed duct heat exchangers as disclosed herein have an integral monolithic body that eliminates most joining processes of a traditional heat exchanger. Additionally, tubular cross sections of such duct heat exchangers are better at retaining pressure and can be made thinner. As a result weights of such duct heat exchangers are approximately half of conventional sheet metal versions and the cost in manufacturing is also less.

To the extent not already described, the different features and structures of the various embodiments may be used in combination with each other as desired. That one feature may not be illustrated in all of the embodiments is not meant to be construed that it may not be, but is done for brevity of description. Thus, the various features of the different embodiments may be mixed and matched as desired to form new embodiments, whether or not the new embodiments are expressly described. All combinations or permutations of features described herein are covered by this disclosure. For example, while the heat exchanger has been illustrated and described as being mounted on the PSS or retro-fit thereto it will be understood that aspects of the invention can be applied to the FADEC as well as other devices where temperatures should be moderated.

Further aspects of the invention are provided by the subject matter of the following clauses:

1. Avionics control assembly, comprising an engine control device having an avionics housing defining an exterior and an interior, with at least one connector extending from the exterior of the avionics housing and at least one sensor located within the interior and a heat exchanger including a duct defining a fluid pathway including at least one fluid passageway leading from an inlet port of the heat exchanger to an outlet port of the heat exchanger, the duct defining a length with a rearmost face and wherein when the duct is operably coupled to the exterior of the avionics housing at least one first portion of the rearmost face is spaced from the exterior of the avionics housing and at least one second portion of the rearmost face is in contact with the exterior of the avionics housing and heat from liquid flowing through the fluid pathway is transferred to the avionics housing.

2. The avionics control assembly of any preceding clause wherein the at least one second portion is formed by an extension protruding from the duct.

3. The avionics control assembly of any preceding clause wherein the exterior of the avionics housing includes a surface feature and the rearmost face of the at least one second portion is complementary in profile to the surface feature.

4. The avionics control assembly of any preceding clause wherein the at least one first portion comprises multiple first portions forming multiple airgaps between the duct and the avionics housing.

5. The avionics control assembly of any preceding clause wherein the fluid passageway does not extend into the extension.

6. The avionics control assembly of any preceding clause wherein the duct comprises a non-constant cross-section between the at least one first portion and the at least one second portion.

7. The avionics control assembly of any preceding clause wherein the fluid passageway of the duct extends towards the rearmost face at the at least one second portion.

8. The avionics control assembly of any preceding clause wherein a corresponding depression is located in an uppermost face or sidewall of the duct at the at least one second portion.

9. The avionics control assembly of any preceding clause, further comprising at least one additional extension protruding from the rearmost surface of the duct and wherein the fluid passageway does not extend into the additional extension, the at least one additional extension configured to form an additional thermal pathway to conductively transfer heat from the heat exchanger to the exterior of the avionics housing.

10. The avionics control assembly of any preceding clause wherein the duct includes an uppermost face, opposite the rearmost face, and the uppermost face is retained via a set of connectors operably coupled to the avionics housing.

11. The avionics control assembly of any preceding clause wherein the set of connectors include multiple hooks wrapped about at least a portion of the uppermost face.

12. The avionics control assembly of any preceding clause, further comprising at least one mounting bracket operably coupling the duct to the avionics housing and spanning the space between at least one first portion of the rearmost face and the exterior of the avionics housing.

13. The avionics control assembly of any preceding clause wherein the set of connectors include at least one mounting bracket seated against the uppermost face.

14. The avionics control assembly of any preceding clause, further comprising a secondary mounting structure having a body spanning between the at least one mounting bracket and an exterior of the avionics housing.

15. The avionics control assembly of any preceding clause, further comprising a heat exchange fluid in the heat exchanger.

16. The avionics control assembly of any preceding clause wherein the heat exchange fluid includes oil.

17. The avionics control assembly of any preceding clause wherein the engine control device is a full authority digital engine control device or a pressure subsystem engine control device.

18. The avionics control assembly of any preceding clause wherein the duct is non-linear along a length of the duct and the at least one second portion comprises multiple second portions along the length.

19. The avionics control assembly of any preceding clause wherein the duct includes a profile that is curved about the at least one connector.

20. The avionics control assembly of any preceding clause wherein the at least one connector includes multiple connectors and the duct is serpentine around the multiple connectors.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. Avionics control assembly, comprising:
   an engine control device having an avionics housing defining an exterior and an interior, with at least one connector extending from the exterior of the avionics housing and at least one sensor located within the interior; and
   a heat exchanger including a duct defining a fluid pathway including at least one fluid passageway leading from an inlet port of the heat exchanger to an outlet port of the heat exchanger, the duct defining a length with a rearmost face and when the duct is operably coupled to the exterior of the avionics housing, at least one first portion of the rearmost face is spaced from the exterior of the avionics housing and at least one second portion of the rearmost face is in contact with the exterior of the avionics housing and heat from liquid flowing through the fluid pathway is transferred to the avionics housing.

2. The avionics control assembly of claim 1 wherein the at least one second portion is formed by an extension protruding from the duct.

3. The avionics control assembly of claim 2 wherein the exterior of the avionics housing includes a surface feature and the rearmost face of the at least one second portion is complementary in profile to the surface feature.

4. The avionics control assembly of claim 2 wherein the at least one first portion comprises multiple first portions forming multiple airgaps between the duct and the avionics housing.

5. The avionics control assembly of claim 2 wherein the fluid passageway does not extend into the extension.

6. The avionics control assembly of claim 1 wherein the duct comprises a non-constant cross-section between the at least one first portion and the at least one second portion.

7. The avionics control assembly of claim 1 wherein the fluid passageway of the duct extends towards the rearmost face at the at least one second portion.

8. The avionics control assembly of claim 7 wherein a corresponding depression is located in an uppermost face or sidewall of the duct at the at least one second portion.

9. The avionics control assembly of claim 7, further comprising at least one additional extension protruding from the duct to define a portion of the rearmost face and wherein the fluid passageway does not extend into the additional extension, the at least one additional extension configured to form an additional thermal pathway to conductively transfer heat from the heat exchanger to the exterior of the avionics housing.

10. The avionics control assembly of claim 1 wherein the duct includes an uppermost face, opposite the rearmost face, and the uppermost face is retained via a set of connectors operably coupled to the avionics housing.

11. The avionics control assembly of claim 10 wherein the set of connectors include multiple hooks wrapped about at least a portion of the uppermost face.

12. The avionics control assembly of claim 11, further comprising at least one mounting bracket operably coupling the duct to the avionics housing and spanning the space between at least one first portion of the rearmost face and the exterior of the avionics housing.

13. The avionics control assembly of claim 10 wherein the set of connectors include at least one mounting bracket seated against the uppermost face.

14. The avionics control assembly of claim 13, further comprising a secondary mounting structure having a body spanning between the at least one mounting bracket and the exterior of the avionics housing.

15. The avionics control assembly of claim 1, further comprising a heat exchange fluid in the heat exchanger.

16. The avionics control assembly of claim 15 wherein the heat exchange fluid includes oil.

17. The avionics control assembly of claim 1 wherein the engine control device is a full authority digital engine control device or a pressure subsystem engine control device.

18. The avionics control assembly of claim 1 wherein the duct is non-linear along a length of the duct and the at least one second portion comprises multiple second portions along the length.

19. The avionics control assembly of claim 1 wherein the duct includes a profile that is curved about the at least one connector.

20. The avionics control assembly of claim 19 wherein the at least one connector includes multiple connectors and the duct is serpentine around the multiple connectors.

* * * * *